(12) United States Patent
Choi et al.

(10) Patent No.: US 8,314,476 B2
(45) Date of Patent: Nov. 20, 2012

(54) SEMICONDUCTOR CHIP AND SEMICONDUCTOR WAFER

(75) Inventors: Jun-Gi Choi, Gyeonggi-do (KR);
Jong-Chern Lee, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 110 days.

(21) Appl. No.: 12/833,672

(22) Filed: Jul. 9, 2010

(65) Prior Publication Data

US 2011/0272790 A1     Nov. 10, 2011

(30) Foreign Application Priority Data

May 7, 2010   (KR) .................. 10-2010-0042828
May 7, 2010   (KR) .................. 10-2010-0042834

(51) Int. Cl.
    *H01L 23/544*     (2006.01)
(52) U.S. Cl. ................................................. 257/620
(58) Field of Classification Search .......... 257/527,
            257/594, 618, 622, 620, E21.569, E21.599;
                                  438/68, 113, 114, 458, 460–465
    See application file for complete search history.

(56) References Cited

U.S. PATENT DOCUMENTS 7,161,175 B2 *   1/2007   Shau ............................. 257/48

FOREIGN PATENT DOCUMENTS

| JP | 06-349926 | 12/1994 |
| KR | 1020040102719 | 12/2004 |
| KR | 1020090074970 | 7/2009 |
| KR | 1020100045836 | 5/2010 |

* cited by examiner

*Primary Examiner* — Dao H Nguyen
*Assistant Examiner* — Tram H Nguyen
(74) *Attorney, Agent, or Firm* — IP & T Group LLP

(57) ABSTRACT

A semiconductor wafer includes at least one chip formed on a substrate, and a scribe line region surrounding the chip. The chip includes a device formation region, and a chip boundary region surrounding the device formation region and formed between the device formation region and the scribe line region. The chip boundary region includes a guard ring structure which physically separates the device formation region from the scribe line region. The guard ring structure includes a signal transfer element which transfers an electric signal between the device formation region and the scribe line region.

13 Claims, 19 Drawing Sheets

SEMICONDUCTOR CHIP AND SEMICONDUCTOR WAFER

CROSS-REFERENCES TO RELATED APPLICATIONS

The present application claims priority of Korean Patent Application Nos. 10-2010-0042828 and 10-2010-0042834, both filed on May 7, 2010, which are incorporated herein by reference in their entirety.

BACKGROUND OF THE INVENTION

Exemplary embodiments of the present invention relate to a semiconductor chip and a semiconductor wafer, and more particularly, to a guard ring structure which physically separates chips on a semiconductor wafer from scribe line regions.

A semiconductor wafer manufactured by a typical fabrication process includes a plurality of semiconductor chips. Since processes performed on the semiconductor wafer are to have high accuracy, the semiconductor wafer undergoes several tests during the processes. For example, a PCM (Process Control Monitor) test may be performed to monitor characteristics of devices and circuits inside semiconductor chips, or a probe test may be performed to monitor operational characteristics of semiconductor chips. In order to perform those tests, test patterns or built-in self test (BIST) circuits are formed in scribe line regions or scribe lane regions, which are defined between semiconductor chips. In a package process after the semiconductor fabrication process, the semiconductor wafer is sawed into the semiconductor chips. At this time, the scribe line region is a sawing reference for separating the semiconductor wafer into individual chips. When the sawing process is performed on the semiconductor wafer during the package process, chip boundary regions are formed on four edges of the respective chips in order to prevent stress and moisture from being applied and penetrating into the semiconductor chips.

A related semiconductor wafer structure is illustrated in FIGS. 1A and 1B. A semiconductor wafer 10 includes a plurality of semiconductor chips (four chips in the drawings). Each of the semiconductor chips includes a device formation region and a chip boundary region. For example, a semiconductor chip 10A includes a device formation region 20A and a chip boundary region 30A surrounding four edges of the device formation region 20A. The remaining semiconductor chips 10B, 10C and 10D include device formation regions 20B, 20C and 20D and chip boundary regions 30B, 30C and 30D, respectively. Scribe line regions 40 are formed between the semiconductor chips 10A, 10B, 10C and 10D.

In the scribe line regions 40 as well as the chip boundary regions 30A, 30B, 30C and 30D, a structure for preventing external stress and moisture from being applied and penetrated into the device formation regions 20A, 20B, 20C and 20D is formed. Meanwhile, as described above, test patterns or test circuits for monitoring characteristics of the semiconductor chips 10A, 10B, 10C and 10D are implemented in the scribe line regions 40. Therefore, in order to perform the test operation through the test patterns or the test circuits, a guard ring structure for transferring signals between the semiconductor chips 10A, 10B, 10C and 10D and the scribe line regions 40 is useful.

SUMMARY OF THE INVENTION

An embodiment of the present invention is directed to a guard ring structure of a chip boundary region and a method for fabricating the same, in which the guard ring structure includes an element for transferring signals between semiconductor chips and scribe line regions for the purpose of performing a test operation through test patterns or test circuits implemented in the scribe line regions disposed between the semiconductor chips in order to monitor characteristics of the semiconductor chips on a semiconductor wafer. The guard ring structure includes an element for physically separating the semiconductor chips from the scribe line regions in order that the semiconductor chips can be immune to mechanical stress occurring during a wafer sawing process, and temperature and humidity change during the use of chips.

In accordance with an embodiment of the present invention, a semiconductor wafer includes at least one chip formed on a substrate, and a scribe line region surrounding the chip. The chip includes a device formation region, and a chip boundary region surrounding the device formation region and formed between the device formation region and the scribe line region. The chip boundary region includes a guard ring structure which physically separates the device formation region from the scribe line region. The guard ring structure includes a signal transfer element which transfers an electric signal between the device formation region and the scribe line region. As an example, the guard ring structure includes an active layer, and at least one pair of a metal contact barrier and a metal layer sequentially stacked on the active layer. As another example, the guard ring structure includes an active layer, a gate structure stacked on the active layer, and at least one pair of a metal contact barrier and a metal layer sequentially stacked on the gate structure.

In accordance with yet another embodiment of the present invention, a semiconductor wafer includes at least one chip formed on a substrate, and a scribe line region surrounding the chip. The chip includes a device formation region, and a chip boundary region surrounding the device formation region and formed between the device formation region and the scribe line region. The chip boundary region includes a guard ring structure which physically separates the device formation region from the scribe line region. The guard ring structure includes: an active layer; a gate structure stacked on the active layer; a first pair of a metal contact barrier and a metal layer sequentially stacked on the gate structure; a second pair of a metal contact barrier and a metal layer sequentially stacked on the metal contact barrier and the metal layer of the first pair; and a third pair of a metal contact barrier and a metal layer sequentially stacked on the metal contact barrier and the metal layer of the second pair. The active layer and the gate structure transfer an electric signal between the device formation region and the scribe line region. The active layer includes: a first active layer element configured to transfer an electric signal between the device formation region and the scribe line region; and second active layer elements disposed on both sides of the first active layer element, while being spaced apart from the first active layer element, and configured to physically separate the device formation region from the scribe line region.

In another embodiment of the present invention, a semiconductor wafer includes at least one chip formed on a substrate, and a scribe line region surrounding the chip. The chip includes a device formation region, and a chip boundary region surrounding the device formation region and formed between the device formation region and the scribe line region. The chip boundary region includes a dual guard ring structure which physically separates the device formation region from the scribe line region. The dual guard ring structure includes a signal transfer element which transfers an electric signal between the device formation region and the scribe line region.

The dual guard ring structure may include: a first guard ring structure configured to physically separate the device formation region from the scribe line region, and transfer an electric signal to/from the device formation region; a second guard ring structure configured to physically separate the scribe line region from the device formation region, and transfer an electric signal to/from the scribe line region; and a mutually coupling element disposed between the first guard ring structure and the second guard ring structure and configured to transfer an electric signal between the device formation region and the scribe line region.

DESCRIPTION OF SPECIFIC EMBODIMENTS

Figure 1A:
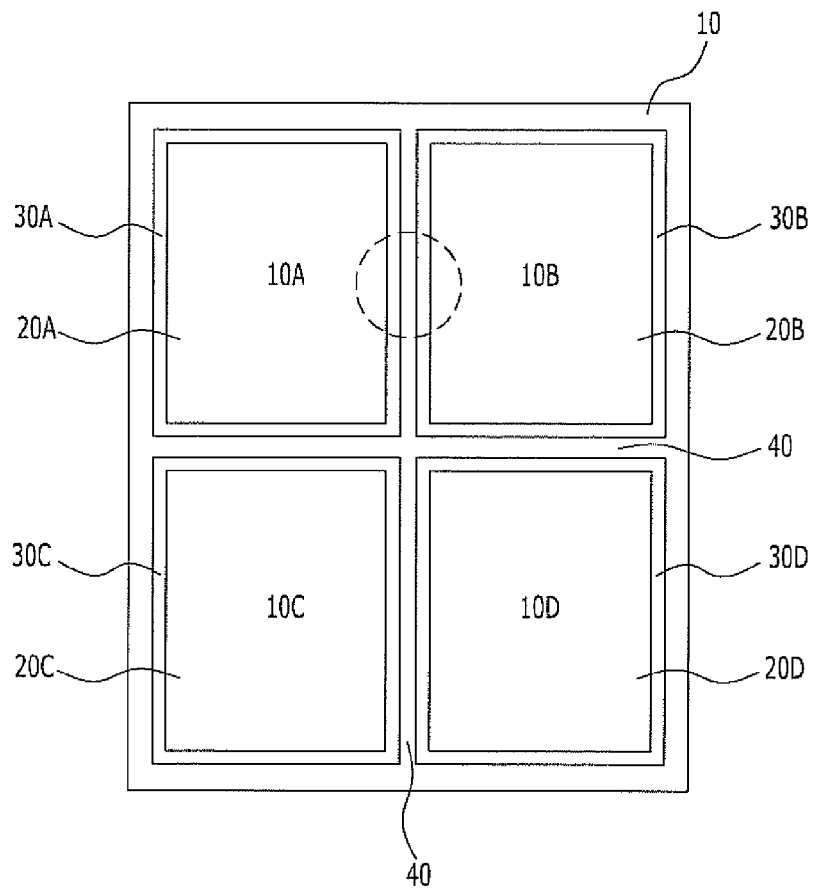
FIGS. 1A and 1B are plan views of a related semiconductor wafer.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

First Exemplary Embodiment

Figure 1B:
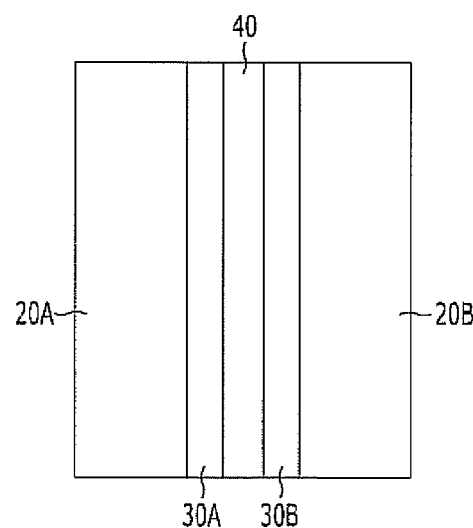

A guard ring structure of a chip boundary region in accordance with an exemplary embodiment of the present invention is implemented on a semiconductor wafer 10 as illustrated in FIGS. 1A and 1B. The semiconductor wafer 10 includes at least one or more chips 10A, 10B, 10C and 10D formed on a substrate, and scribe line regions 40 surrounding the chips 10A, 10B, 10C and 10D. For example, the chip 10A includes a device formation region 20A and a chip boundary region 30A. The chip 10B includes a device formation region 20B and a chip boundary region 30B. The chip 10C includes a device formation region 20C and a chip boundary region 30C. The chip 10D includes a device formation region 20D and a chip boundary region 30D. The chip boundary region 30A surrounds the device formation region 20A and is formed between the device formation region 20A and the scribe line region 40. The chip boundary region 30A has a guard ring structure which physically separates the device formation region 20A from the scribe line region 40.

Figure 2:
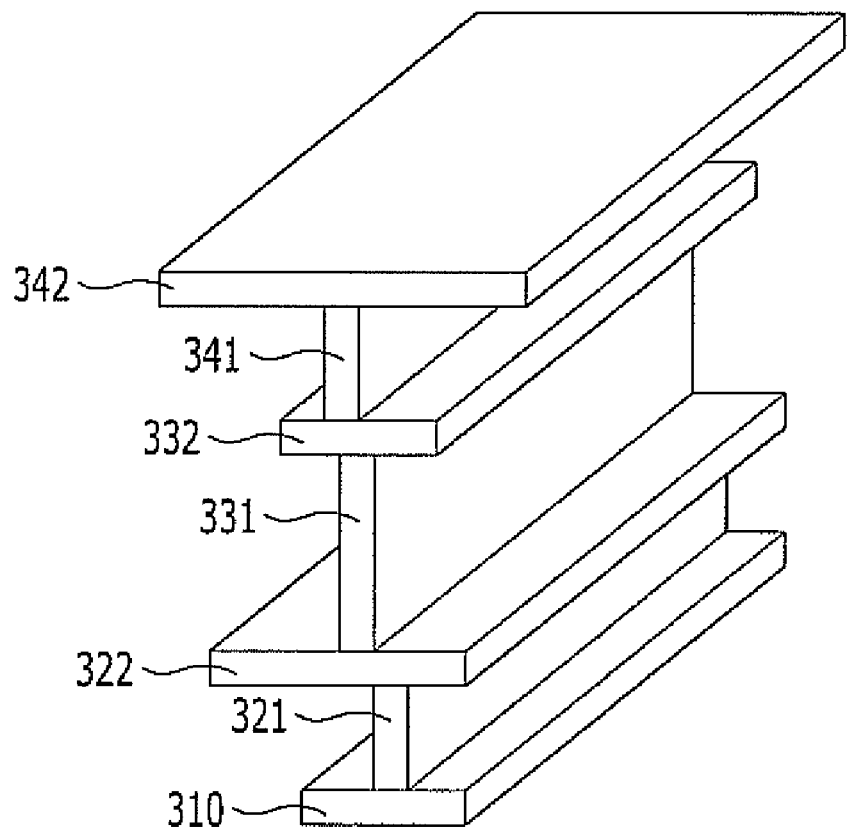
FIG. 2 is a perspective view of a guard ring structure of a chip boundary region illustrated in FIGS. 1A and 1B in accordance with an embodiment of the present invention.
Figure 3:
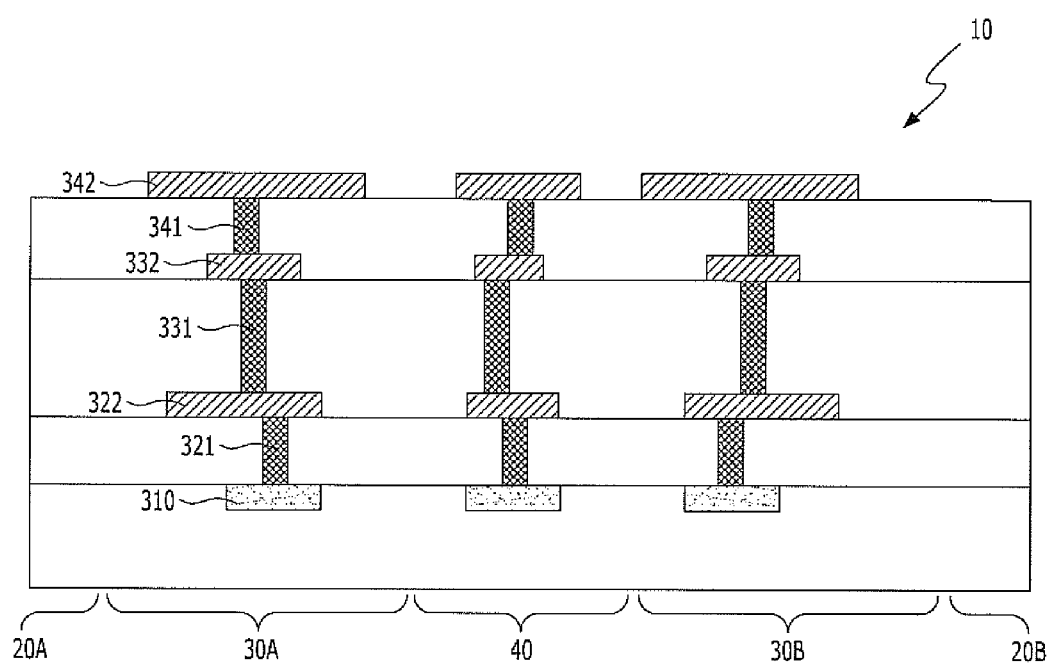
FIG. 3 is a cross-sectional view of the guard ring structure of the chip boundary region illustrated in FIGS. 1A and 1B in accordance with an embodiment of the present invention.
Figure 4A:
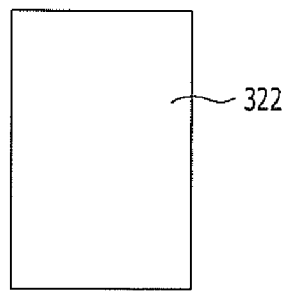
FIGS. 4A to 4D are plan views of the guard ring structure of the chip boundary region illustrated in FIGS. 1A and 1B in accordance with an embodiment of the present invention.
Figure 4B:
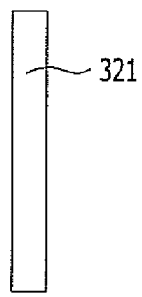
Figure 4C:
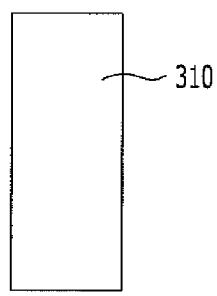
Figure 4D:
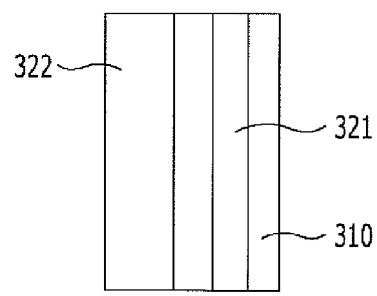

According to FIGS. 2 and 3, a guard ring structure according to an exemplary embodiment is formed by sequentially stacking an active layer 310, a first metal contact barrier 321, a first metal layer 322, a second metal contact barrier 331, a second metal layer 332, a third metal contact barrier 341, and a third metal layer 342. A planar structure of the first metal layer 322, the first metal contact barrier 321, and the active layer 310 is illustrated in FIGS. 4A to 4D.

Figure 5:
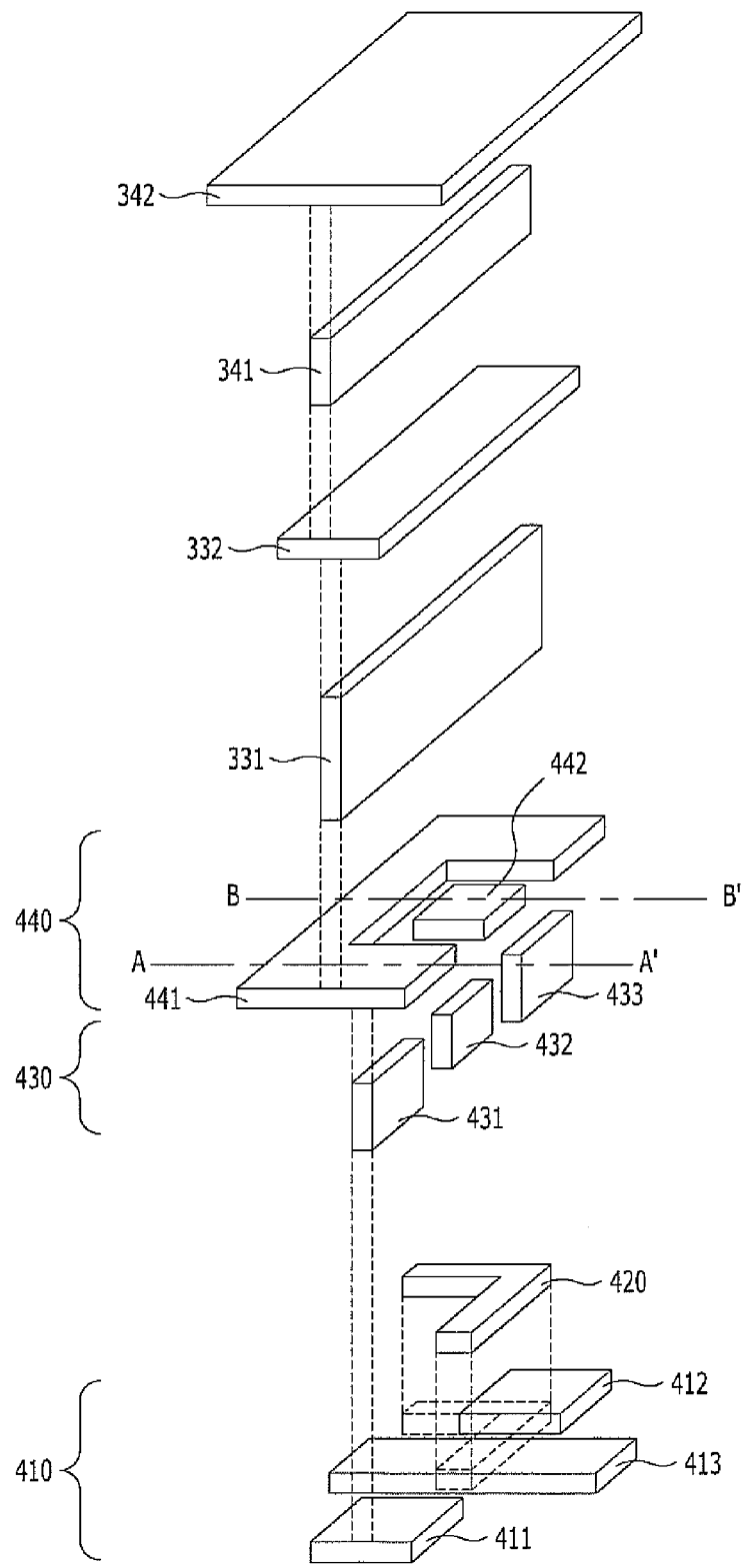
FIG. 5 is a perspective view of a guard ring structure of a chip boundary region in accordance with a first embodiment of the present invention.

FIG. 5 is a perspective view of a guard ring structure in accordance with a first embodiment of the present invention. The guard ring structure includes an active layer 410. A gate structure 420 is stacked on the active layer 410. At least one pair of a metal contact barrier and a metal layer (e.g., 430 and 440) is stacked on the active layer 410. Although three pairs of metal contact barriers and metal layers stacked on the active layer 410 are described as an example, the number of the pairs of the metal contact barriers and the metal layers may vary. The first pair of the metal contact barrier 430 and the metal layer 440 is sequentially stacked on the gate structure 420. The second pair of the metal contact barrier 331 and the metal layer 332 is sequentially stacked on the metal contact barrier 430 and the metal layer 440 of the first pair. The third pair of the metal contact barrier 341 and the metal layer 342 is sequentially stacked on the metal contact barrier 331 and the metal layer 332 of the second pair.

The active layer 410 and the gate structure 420 transfer electric signals between the device formation region 20A and the scribe line region 40. The active layer 410 includes active layer elements 411, 412 and 413. The active layer element 413 transfers electric signals between the device formation region 20A and the scribe line region 40. The active layer element 411 is disposed around the active layer element 413, while being spaced apart from the active layer element 413. The active layer element 412 is disposed on the other side of the active layer element 413, while being spaced apart from the active layer element 413. In this manner, the active layer elements 411 and 412 are disposed on both sides of the active layer element 413, while being spaced apart from the active layer element 413. The active layer elements 411 and 412 physically separate the device formation region 20A from the scribe line region 40. The physical separation refers to physically isolating the semiconductor chips from the scribe line regions in order that the semiconductor chips can be immune to mechanical stress occurring during a subsequent wafer sawing process, and temperature and humidity change during the use of the chips.

The active layer element 413 and the gate structure 420 operate as a switch for transferring electric signals between the device formation region 20A and the scribe line region 40. The function of transferring the electric signals refers to exchanging signals between the chips and the scribe line regions 40 for the purpose of performing a test operation through test patterns or test circuits implemented in the scribe line regions 40 disposed between the chips in order to monitor characteristics of the chips on the semiconductor wafer.

The metal contact barrier 430 includes contact barrier elements 431, 432 and 433. The contact barrier element 432 is stacked on the active layer element 413. The contact barrier elements 431 and 433 are disposed on both sides of the contact barrier element 432, while being spaced apart from the contact barrier element 432, and are stacked on the active layer elements 411 and 412.

The metal layer 440 includes metal layer elements 441 and 442. The metal layer element 442 is stacked on the contact barrier element 432. The metal layer element 441 is stacked on the contact barrier elements 431 and 433. The metal layer element 441 surrounds a portion of edges of the metal layer element 442 but is spaced apart from the metal layer element 442.

The metal contact barrier 331 is stacked on the metal layer 440. The metal layer 332 is stacked on the metal contact barrier 331. The metal contact barrier 341 is stacked on the metal layer 332. The metal layer 342 is stacked on the metal contact barrier 341.

Figure 6:
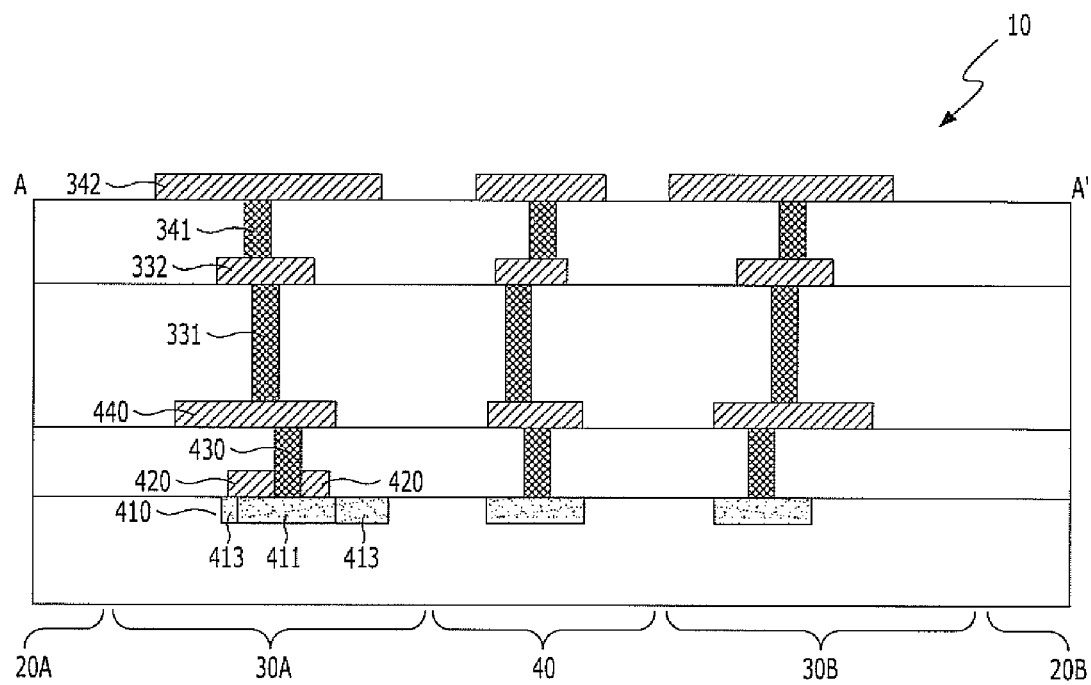
FIGS. 6 and 7 are cross-sectional views of the guard ring structure of the chip boundary region in accordance with the first embodiment of the present invention.
Figure 7:
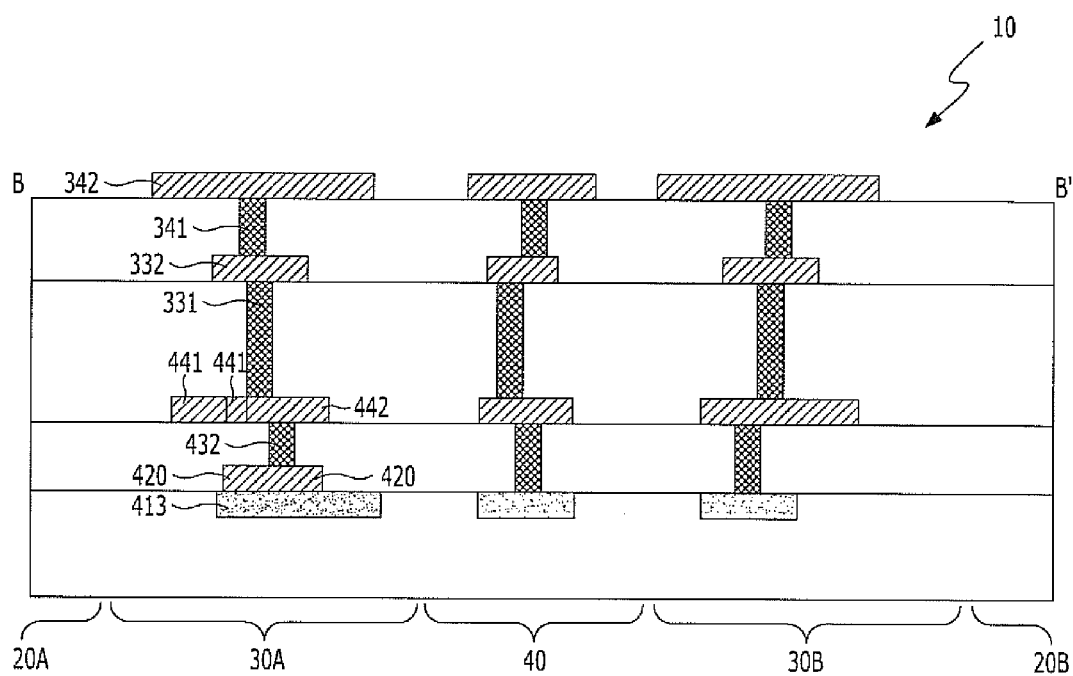

FIGS. 6 and 7 are cross-sectional views of the guard ring structure in accordance with the first embodiment of the present invention. Specifically, FIG. 6 is a cross-sectional view of the guard ring structure along line A-A' in FIG. 5, and FIG. 7 is a cross-sectional view of the guard ring structure along line B-B' in FIG. 5. A case in which the guard ring structure in accordance with an exemplary embodiment of the present invention is formed in the chip boundary region 30A will be described below. Specifically, a case in which electrical signals can be transferred between the device formation region 20A and the scribe line region 40 will be exemplarily described. When considering the transfer of the electric signals between the device formation region 20B and the scribe line region 40, it should be noted that the guard ring structure formed in the chip boundary region 30A can also be similarly formed in the chip boundary region 30B.

Referring to FIG. 6, the active layer elements 411 and 413 are stacked on the semiconductor substrate. The gate structure 420 and the metal contact barrier 430 are stacked on the active layer elements 411 and 413. The gate structure 420 and the metal contact barrier 430 may be formed with an interlayer dielectric layer formed between them. The metal layer 440 is stacked on the metal contact barrier 430. The metal contact barrier 331 is stacked on the metal layer 440. The metal layer 440 and the metal contact barrier 331 may be formed with an interlayer dielectric layer between them. The metal layer 332 is stacked on the metal contact barrier 331. The metal contact barrier 341 is stacked on the metal layer 332. The metal layer 332 and the metal contact barrier 341 may be formed with an interlayer dielectric layer between them. The metal layer 342 is stacked on the metal contact barrier 341. Although the case in which the three pairs of the metal contact barriers and the metal layers constitute the guard ring structure has been exemplarily described above, the number of the pairs of the metal contact barriers and the metal layers may vary.

Referring to FIG. 7, the active layer element 413 is stacked on the semiconductor substrate. The gate structure 420 and the metal contact barrier 432 are stacked on the active layer element 413. The gate structure 420 and the metal contact barrier 432 may be formed with an interlayer dielectric layer formed between them. The metal layer elements 441 and 442 are stacked on the metal contact barrier 432. The metal contact barrier 331 is stacked on the metal layer elements 441 and 442. The metal layer elements 441 and 442 and the metal contact barrier 331 may be formed with an interlayer dielectric layer formed between them. The metal layer 332 is stacked on the metal contact barrier 331. The metal contact barrier 341 is stacked on the metal layer 332. The metal layer 332 and the metal contact barrier 341 may be formed with an interlayer dielectric layer between them. The metal layer 342 is stacked on the metal contact barrier 341. Although the case in which the three pairs of the metal contact barriers and the metal layers constitute the guard ring structure has been exemplarily described above, the number of the pairs of the metal contact barriers and the metal layers may vary.

FIGS. 8A to 8D are plan views illustrating the guard ring structure of the chip boundary region in accordance with the first embodiment of the present invention. FIGS. 9A to 9D are plan views illustrating the guard ring structure of the chip boundary region in accordance with the first embodiment of the present invention.

Figure 8A:
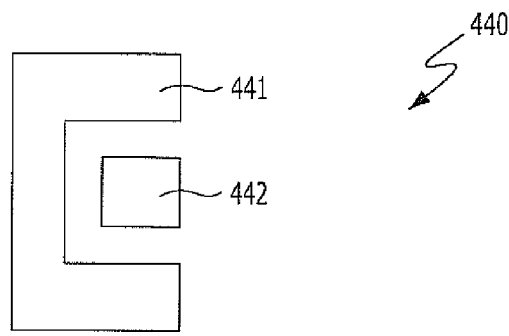
FIGS. 8A to 8D are plan views of the guard ring structure of the chip boundary region in accordance with the first embodiment of the present invention.

Referring to FIG. 8A, the metal layer 440 includes the metal layer elements 441 and 442. The metal layer element 442 has a rectangular shape. The metal layer element 441 is formed to surround a portion of the edges of the metal layer element 442. For example, the metal layer element 441 has a "⊏" shape to surround an upper edge, a left edge, and a lower edge of the metal layer element 442.

Figure 8B:
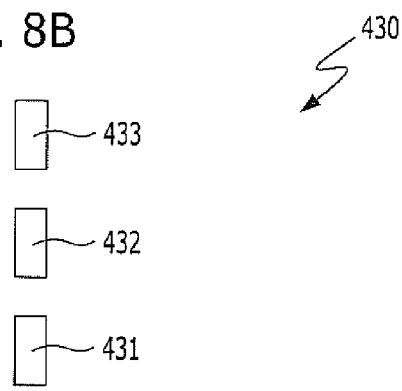
Figure 9A:
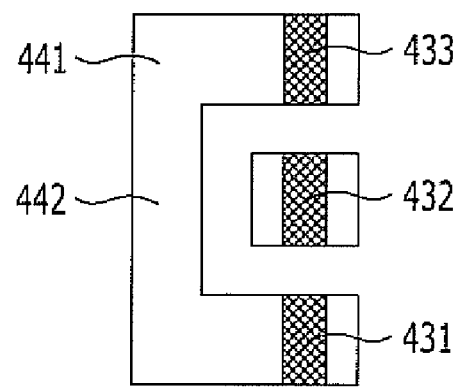
FIGS. 9A to 9D are plan views of the guard ring structure of the chip boundary region in accordance with the first embodiment of the present invention.

Referring to FIG. 8B, the metal contact barrier 430 includes the contact barrier elements 431, 432 and 433. The contact barrier element 433 is disposed on the contact barrier element 432, while being spaced apart from the contact barrier element 432. The contact barrier element 431 is disposed under the contact barrier element 432, while being spaced apart from the contact barrier element 432. As illustrated in FIG. 9A, the contact barrier element 432 is formed under the metal layer element 442, and the contact barrier elements 431 and 433 are formed under the metal layer element 441.

Figure 8C:
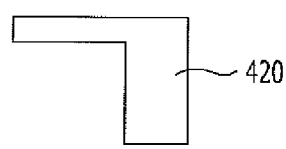
Figure 9B:
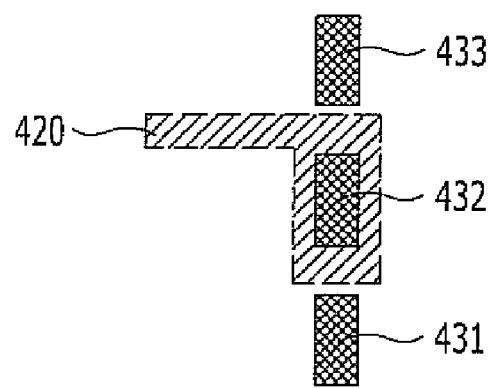

Referring to FIG. 8C, the gate structure 420 has a "⊣" shape. As illustrated in FIG. 9B, the gate structure 420 is formed under the contact barrier element 432, between the contact barrier elements 433 and 432, and between the contact barrier elements 432 and 431.

Figure 8D:
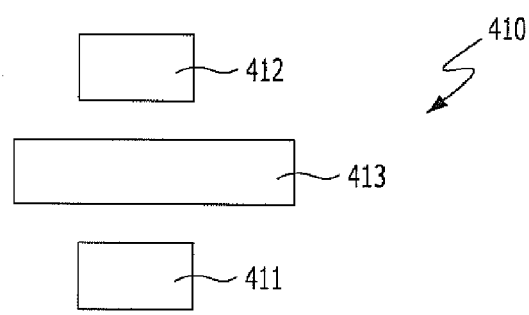
Figure 9C:
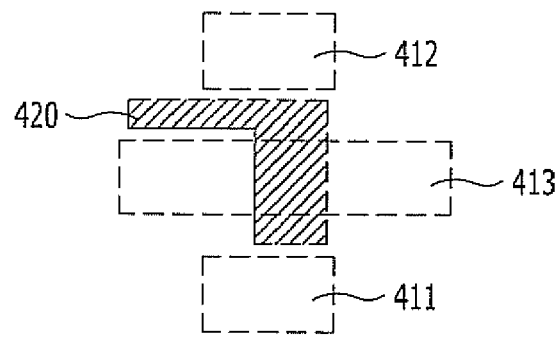
Figure 9D:
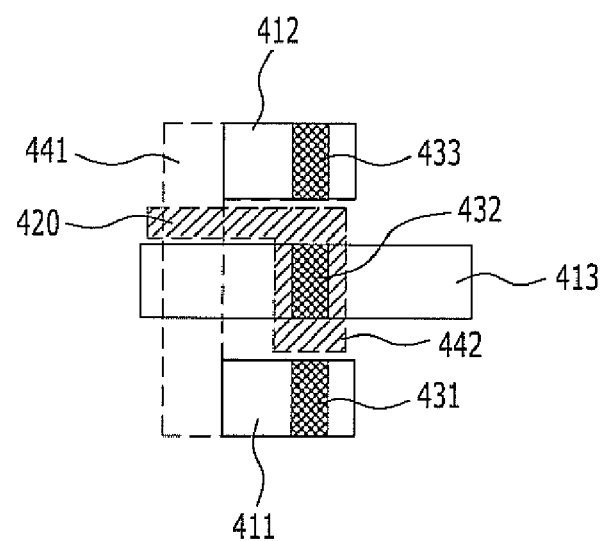

Referring to FIG. 8D, the active layer 410 includes the active layer elements 411, 412 and 413. The active layer element 411 is disposed under the active layer element 413, while being spaced apart from the active layer element 413. The active layer element 412 is disposed above the active layer element 413, while being spaced apart from the active layer element 413. As illustrated in FIG. 9C, the active layer element 413 is formed to have a width larger than those of the active layer elements 411 and 412. The gate structure 420 is formed above the active layer element 413, between the active layer elements 412 and 413, and between the active layer elements 411 and 413.

Figure 10A:
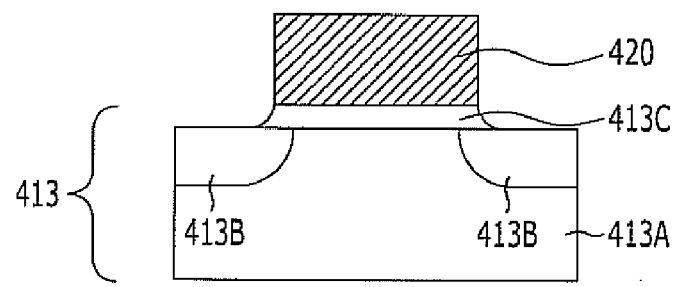
FIG. 10A is a cross-sectional view illustrating the connection between an active layer and a gate structure in the guard ring structure of the chip boundary region in accordance with the first embodiment of the present invention.
Figure 10B:
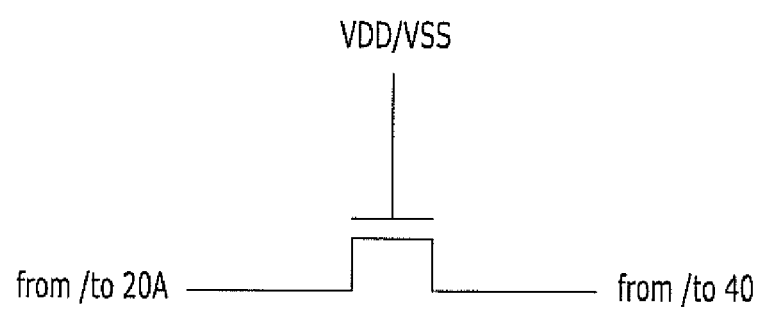
FIG. 10B is an equivalent circuit diagram illustrating the connection between the active layer and the gate structure in the guard ring structure of the chip boundary region in accordance with the first embodiment of the present invention.

FIG. 10A is a cross-sectional view illustrating the connection between the active layer and the gate structure in the guard ring structure of the chip boundary region in accordance with the first embodiment of the present invention. FIG. 10B is an equivalent circuit diagram illustrating the connection between the active layer and the gate structure in the guard ring structure of the chip boundary region in accordance with the first embodiment of the present invention.

Referring to FIG. 10A, the active layer element 413 is formed under the gate structure 420. The active layer element 413 includes a substrate 413A, source/drain regions 413B, and an interlayer dielectric layer 413C. The gate structure 420 refers to elements which constitute a gate of a metal oxide semiconductor (MOS) transistor, including a control gate.

Referring to FIG. 10B, the active layer element 413 and the gate structure 420 function as a switch such as a MOS transistor and transfers electric signals between the device formation region 20A and the scribe line region 40. The electric signals refer to signals, related to a PCM test or a PT1 test, which are exchanged when monitoring characteristics of the devices and circuits formed on the device formation region 20A through test patterns or test circuits formed in the scribe line regions 40.

The MOS transistor of the active layer element 413 and the gate structure 420 is switched on through a fuse in the PCM test or the PT1 test, and switched off by cutting the fuse before a package process. During the test, the MOS transistor is switched on so that the device formation region 20A and the scribe line region 40 of the semiconductor chip are coupled together. On the other hand, when the MOS transistor of the active layer element 413 and the gate structure 420 is switched off through the fuse cutting, the path coupling the device formation region 20A and the scribe line region 40 is disconnected. Accordingly, the semiconductor chips is immune to mechanical stress occurring during the wafer sawing process, and temperature and humidity change during the use of the chips.

Second Embodiment

Figure 11:
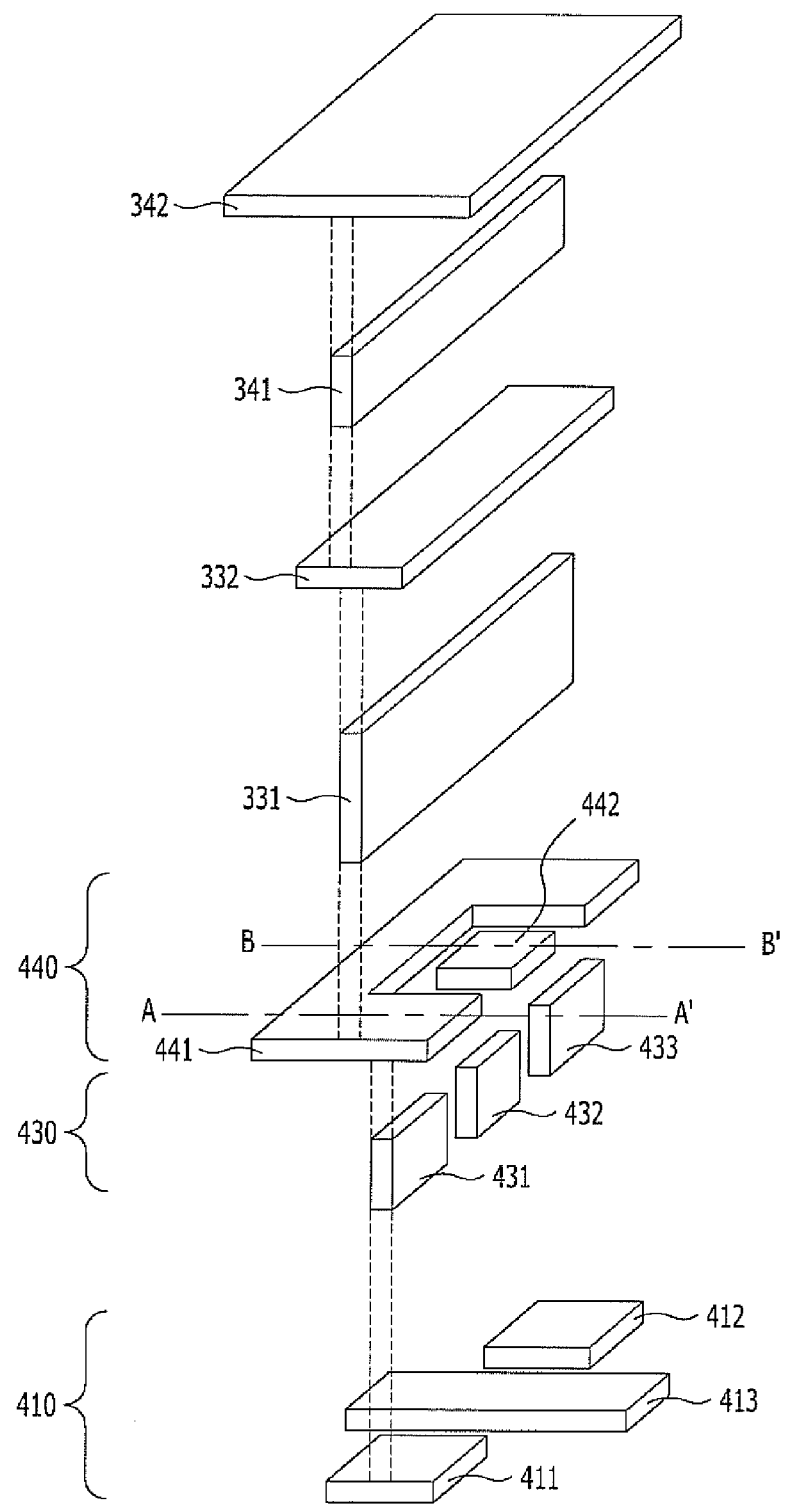
FIG. 11 is a perspective view of a guard ring structure of a chip boundary region in accordance with a second embodiment of the present invention.

A guard ring structure of a chip boundary region in accordance with a second embodiment of the present invention is implemented on a semiconductor wafer 10 as illustrated in FIGS. 1A and 1B. FIG. 11 is a perspective view of the guard ring structure in accordance with another embodiment of the present invention. The guard ring structure includes an active layer 410. At least one pair of a metal contact barrier and a metal layer (e.g., 430 and 440) is stacked on the active layer 410. Although three pairs of metal contact barriers and metal layers stacked on the active layer 410 are described as an example, the number of the pairs of the metal contact barriers and the metal layers may vary. The first pair of the metal contact barrier 430 and the metal layer 440 is sequentially stacked on the active layer 410. The second pair of the metal contact barrier 331 and the metal layer 332 is sequentially stacked on the metal contact barrier 430 and the metal layer 440 of the first pair. The third pair of the metal contact barrier 341 and the metal layer 342 is sequentially stacked on the metal contact barrier 331 and the metal layer 332 of the second pair.

The active layer 410 transfers electric signals between the device formation region 20A and the scribe line region 40. The active layer 410 includes active layer elements 411, 412 and 413. The active layer element 413 transfers electric signals between the device formation region 20A and the scribe line region 40. The active layer element 411 is disposed under the active layer element 413, while being spaced apart from the active layer element 413. The active layer element 412 is disposed above the active layer element 413, while being spaced apart from the active layer element 413. In this manner, the active layer elements 411 and 412 are disposed on both sides of the active layer element 413, while being spaced apart from the active layer element 413. The active layer elements 411 and 412 physically separate the device formation region 20A from the scribe line region 40.

The active layer element 413 operates as a resistor passive element for transferring electric signals between the device formation region 20A and the scribe line region 40.

The metal contact barrier 430 includes contact barrier elements 431, 432 and 433. The contact barrier element 432 is stacked on the active layer element 413. The contact barrier elements 431 and 433 are disposed on both sides of the contact barrier element 432, while being spaced apart from the contact barrier element 432, and are stacked on the active layer elements 411 and 412.

The metal layer 440 includes metal layer elements 441 and 442. The metal layer element 442 is stacked on the contact barrier element 432. The metal layer element 441 is stacked on the contact barrier elements 431 and 433. The metal layer element 441 surrounds a portion of edges of the metal layer element 442 but is spaced apart from the metal layer element 442.

The metal contact barrier 331 is stacked on the metal layer 440. The metal layer 332 is stacked on the metal contact barrier 331. The metal contact barrier 341 is stacked on the metal layer 332. The metal layer 342 is stacked on the metal contact barrier 341.

Figure 12:
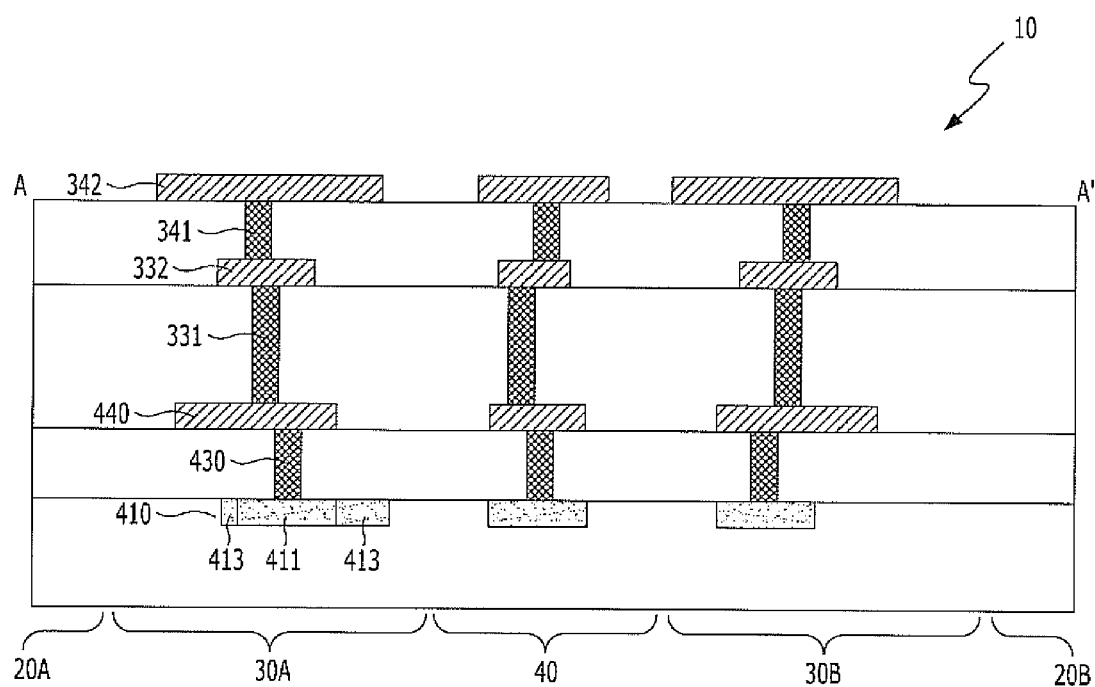
FIGS. 12 and 13 are cross-sectional views of the guard ring structure of the chip boundary region in accordance with the second embodiment of the present invention.
Figure 13:
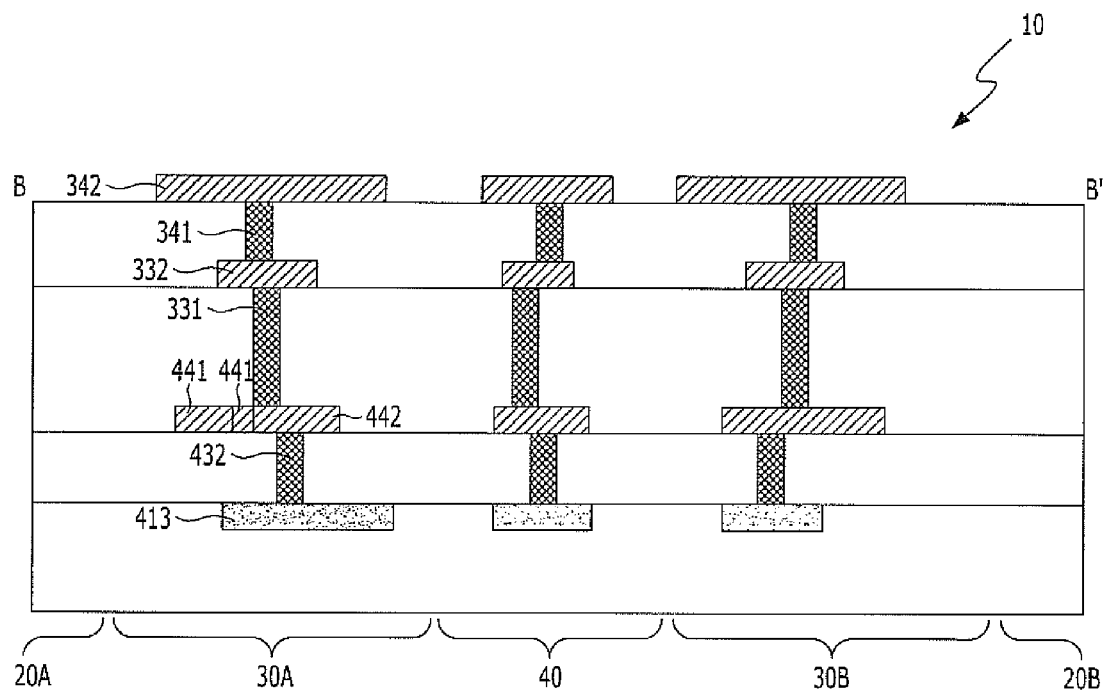

FIGS. 12 and 13 are cross-sectional views of the guard ring structure in accordance with the second embodiment of the present invention. Specifically, FIG. 12 is a cross-sectional view of the guard ring structure along line A-A' in FIG. 11, and FIG. 13 is a cross-sectional view of the guard ring structure along line B-B' in FIG. 11. A case in which the guard ring structure in accordance with an exemplary embodiment of the present invention is formed in the chip boundary region 30A will be described below. Specifically, a case in which electrical signals can be transferred between the device formation region 20A and the scribe line region 40 will be exemplarily described. When considering the transfer of the electric signals between the device formation region 20B and the scribe line region 40, it should be noted that the guard ring structure formed in the chip boundary region 30A can also be similarly formed in the chip boundary region 30B.

Referring to FIG. 12, the active layer elements 411 and 413 are stacked on the semiconductor substrate. The metal contact barrier 430 is stacked on the active layer elements 411 and 413. The metal contact barrier 430 may be formed with an interlayer dielectric layer on the metal contact barrier 430. The metal layer 440 is stacked on the metal contact barrier 430. The metal contact barrier 331 is stacked on the metal layer 440. The metal layer 440 and the metal contact barrier 331 may be formed with an interlayer dielectric layer formed between them. The metal layer 332 is stacked on the metal contact barrier 331. The metal contact barrier 341 is stacked on the metal layer 332. The metal layer 332 and the metal contact barrier 341 may be formed with an interlayer dielectric layer formed between them. The metal layer 342 is stacked on the metal contact barrier 341. Although the case in which the three pairs of the metal contact barriers and the metal layers constitute the guard ring structure has been exemplarily described above, the number of the pairs of the metal contact barriers and the metal layers may vary.

Referring to FIG. 13, the active layer element 413 is stacked on the semiconductor substrate. The metal contact barrier 432 is stacked on the active layer element 413. On the metal contact barrier 432, an interlayer dielectric layer may be formed. The metal layer elements 441 and 442 are stacked on the metal contact barrier 432. The metal contact barrier 331 is stacked on the metal layer elements 441 and 442. The metal layer elements 441 and 442 and the metal contact barrier 331 may be formed with an interlayer dielectric layer formed between them. The metal layer 332 is stacked on the metal contact barrier 331. The metal contact barrier 341 is stacked on the metal layer 332. The metal layer 332 and the metal contact barrier 341 may be formed with an interlayer dielectric layer formed between them. The metal layer 342 is stacked on the metal contact barrier 341. Although the case in which the three pairs of the metal contact barriers and the metal layers constitute the guard ring structure has been exemplarily described above, the number of the pairs of the metal contact barriers and the metal layers may vary.

Figure 14:
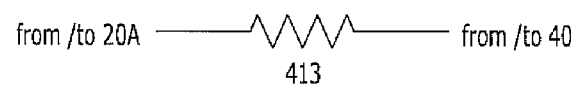
FIG. 14 is an equivalent circuit diagram illustrating an active layer in the guard ring structure of the chip boundary region in accordance with the second embodiment of the present invention.

FIG. 14 is an equivalent circuit diagram illustrating the active layer in the guard ring structure of the chip boundary region in accordance with the second embodiment of the present invention. The active layer element 413 operates as a resistor passive element for transferring electric signals between the device formation region 20A and the scribe line region 40.

During a PCM test or a PT1 test, the resistor passive element of the active layer element 413 serves as a path for transferring electric signals between the device formation region 20A and the scribe line region 40. On the other hand, when the chip boundary region is cut through the fuse cutting, a path coupling the device formation region 20A and the scribe line region 40 is disconnected. Accordingly, the semiconductor chips can is immune to or less affected by mechanical stress occurring during the wafer sawing process, and temperature and humidity change during the use of the chips.

Third Embodiment

Figure 15:
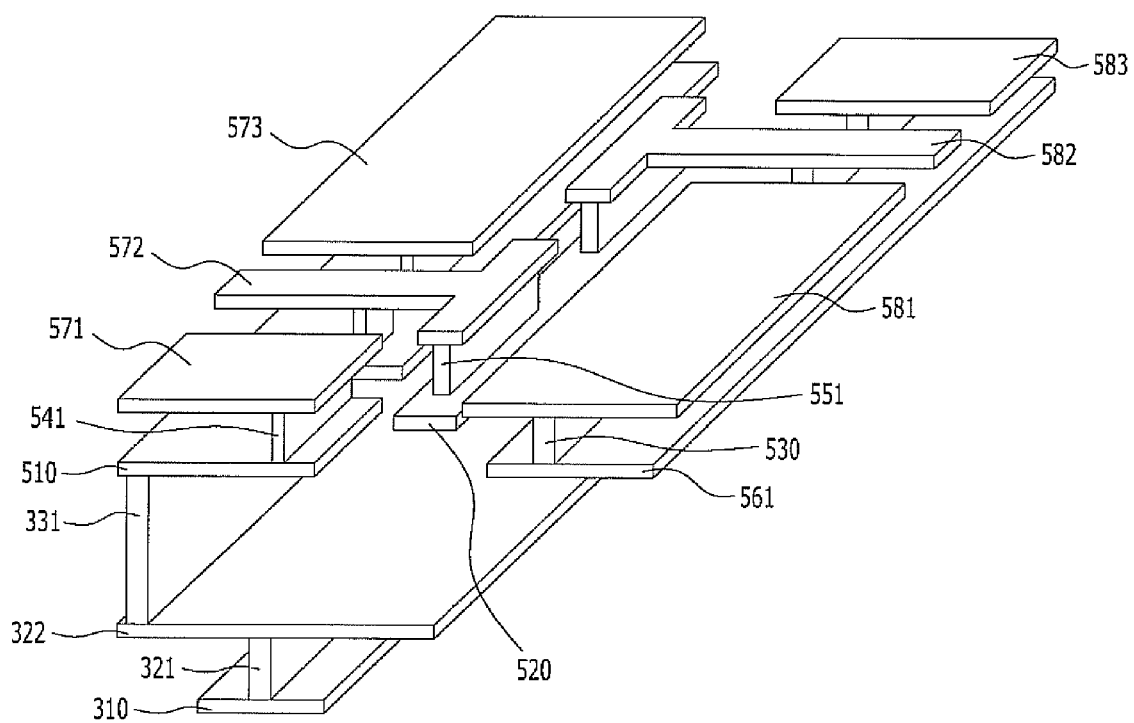
FIG. 15 is a perspective view of a guard ring structure of a chip boundary region in accordance with a third embodiment of the present invention.

FIG. 15 is a perspective view of a guard ring structure of a chip boundary region in accordance with a third embodiment of the present invention. The guard ring structure includes a common guard ring structure and a dual guard ring structure. The common guard ring structure is formed on a substrate and functions to physically separate a device formation region 20A from a scribe line region 40. The physical separation refers to physically isolating the semiconductor chips from the scribe line regions in order that the semiconductor chips can be immune to/less affected by mechanical stress occurring during a subsequent wafer sawing process, and temperature and humidity change during the use of the chips.

The common guard ring structure refers to a structure which includes an active layer 310, a metal contact barrier 321, a metal layer 322, and a metal contact barrier 331 and is implemented on the left of the dual guard ring structure in FIG. 15. The active layer 310 is formed on the substrate. The metal contact barrier 321 is formed on the active layer 310. The metal layer 322 is formed on the metal contact barrier 321. The metal contact barrier 331 is formed on the metal layer 322.

The dual guard ring structure is formed on the common guard ring structure. The dual guard ring structure (that is, a structure implemented on the right of the dual guard ring structure in FIG. 15) functions to physically separate the device formation region 20A from the scribe line region 40, and also functions to transfer electric signals between the device formation region 20A and the scribe line region 40. As described above, the physical separation refers to physically isolating the semiconductor chips from the scribe line regions in order that the semiconductor chips can be immune or less subject to mechanical stress occurring during a subsequent wafer sawing process, and temperature and humidity change during the use of the chips. The function of transferring the electric signals refers to exchanging signals between the chips and the scribe line regions 40 for the purpose of performing a test operation through test patterns or test circuits implemented in the scribe line regions 40 disposed between the chips in order to monitor characteristics of the chips on the semiconductor wafer.

The dual guard ring structure in FIG. 15 includes a first guard ring structure, a second guard ring structure, and a mutually coupling element. The first guard ring structure refers to a structure implemented on the left of the dual guard ring structure. The second guard ring structure refers to a structure implemented on the right of the dual guard ring structure. The mutually coupling element refers to a structure disposed at the center of the dual guard ring structure, that is, a structure disposed between the first guard ring structure and the second guard ring structure, and may, for example, include metal layer 520, metal contact barriers 551 and 552 (shown in FIG. 18), and upper metal layers 572 and 583.

The first guard ring structure (that is, a structure implemented on the left of the dual guard ring structure in FIG. 15) physically separates the device formation region 20A from the scribe line region 40, and transfers electric signals to/from the device formation region 20A. The second first guard ring structure physically separates the scribe line region 40 from the device formation region 20A, and transfers electric signals to/from the scribe line region 40. The mutually coupling element (for example, metal layer 520, metal contact barriers 551 and 552 (shown in FIG. 18), and upper metal layers 572 and 583) is disposed between the first guard ring structure and the second guard ring structure, and transfers electric signals between the device formation region 20A and the scribe line region 40.

The first guard ring structure, the second guard ring structure, and the mutually coupling element include lower metal layers, metal contact barriers stacked on the lower metal layers, and upper metal layers stacked on the metal contact barriers. The first guard ring structure includes lower metal layers 510 and 511 (shown in FIG. 19), metal contact barriers 541, 542 and 543 (shown in FIG. 17), and upper metal layers 571, 572 and 573 (shown in FIG. 19). The second guard ring structure includes lower metal layers 530 and 531, metal contact barriers 561, 562 and 563, and upper metal layers 581, 582 and 583. The mutually coupling element includes a lower metal layer 520, metal contact barriers 551 and 552, and upper metal layers 572 and 583.

Figure 16:
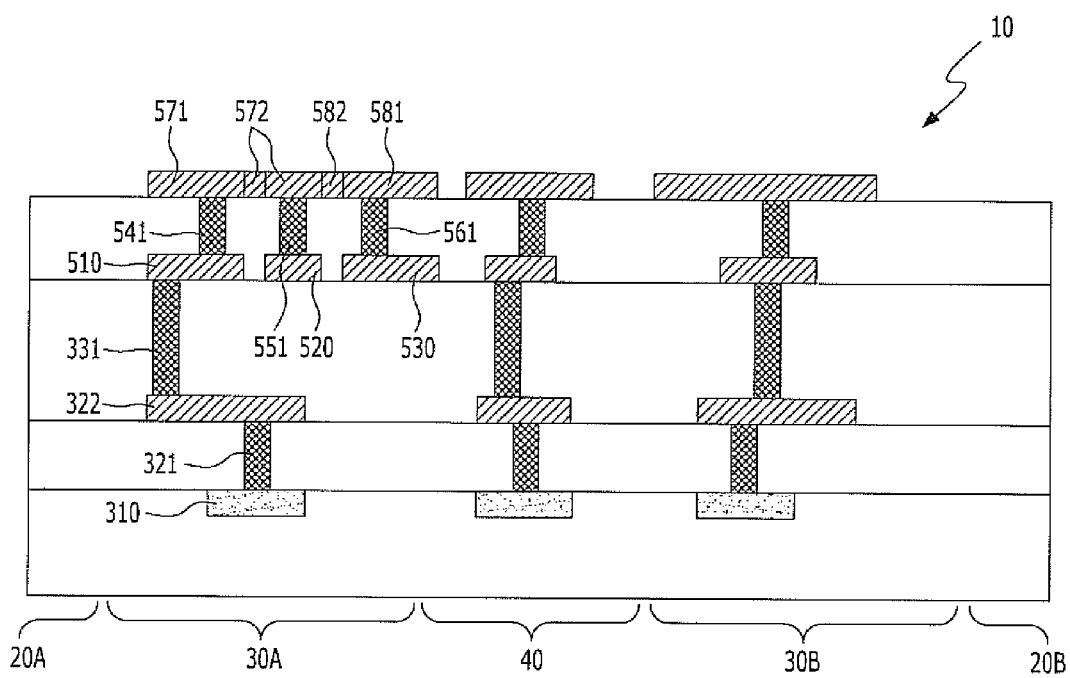
FIG. 16 is a cross-sectional view illustrating the guard line structure of the chip boundary region in accordance with the third embodiment of the present invention.

FIG. 16 is a cross-sectional view illustrating the guard ring structure of the chip boundary region in accordance with the third embodiment of the present invention. A case in which the guard ring structure in accordance with an exemplary embodiment of the present invention is formed in the chip boundary region 30A will be described below. Specifically, a case in which electrical signals can be transferred between the device formation region 20A and the scribe line region 40 will be exemplarily described. When considering the transfer of the electric signals between the device formation region 20B and the scribe line region 40, it should be noted that the guard ring structure formed in the chip boundary region 30A can also be similarly formed in the chip boundary region 30B.

Referring to FIG. 16, an active layer element 310 is stacked on a semiconductor substrate. A metal contact barrier 321 is stacked on the active layer element 310. On the metal contact barrier 321, an interlayer dielectric layer may be formed. A metal layer 322 is stacked on the metal contact barrier 321. A metal contact barrier 331 is stacked on the metal layer 322. The metal layer 322 and the metal contact barrier 331 may be formed with an interlayer dielectric layer formed between them. Metal layers 510, 520 and 530 are stacked on the metal contact barrier 331, while being spaced apart from one another. A metal contact barrier 541 is stacked on the metal layer 510. A metal contact barrier 551 is stacked on the metal layer 520. A metal contact barrier 561 is stacked on the metal layer 530. The metal layers 510, 520 and 530 and the metal contact barriers 541, 551 and 561 may be formed with an interlayer dielectric layer formed between them. A metal layer 571 is stacked on the metal contact barrier 541. A metal layer 572 is stacked on the metal contact barrier 551. A metal layer 581 is stacked on the metal contact barrier 561.

Figure 17:
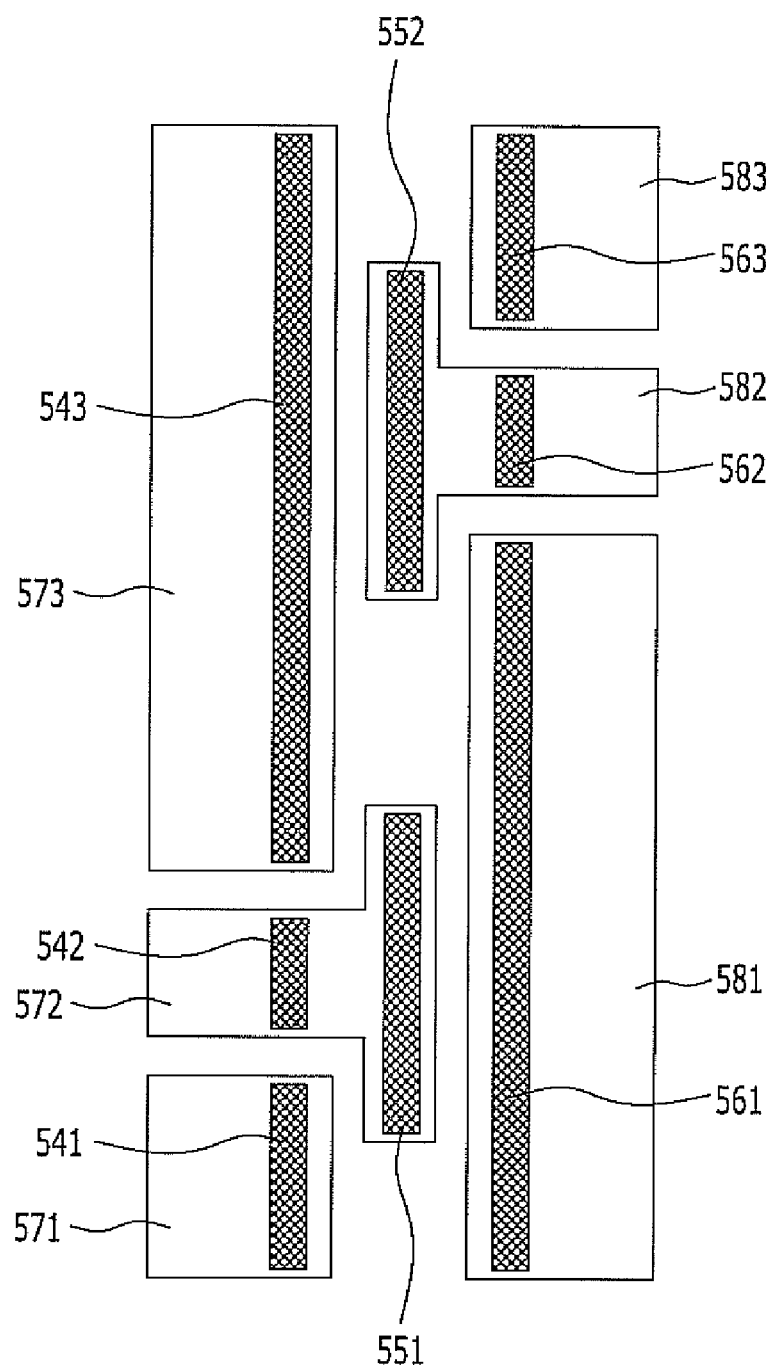
FIGS. 17 to 19 are plan views illustrating the guard ring structure of the chip boundary region in accordance with the third embodiment of the present invention.
Figure 18:
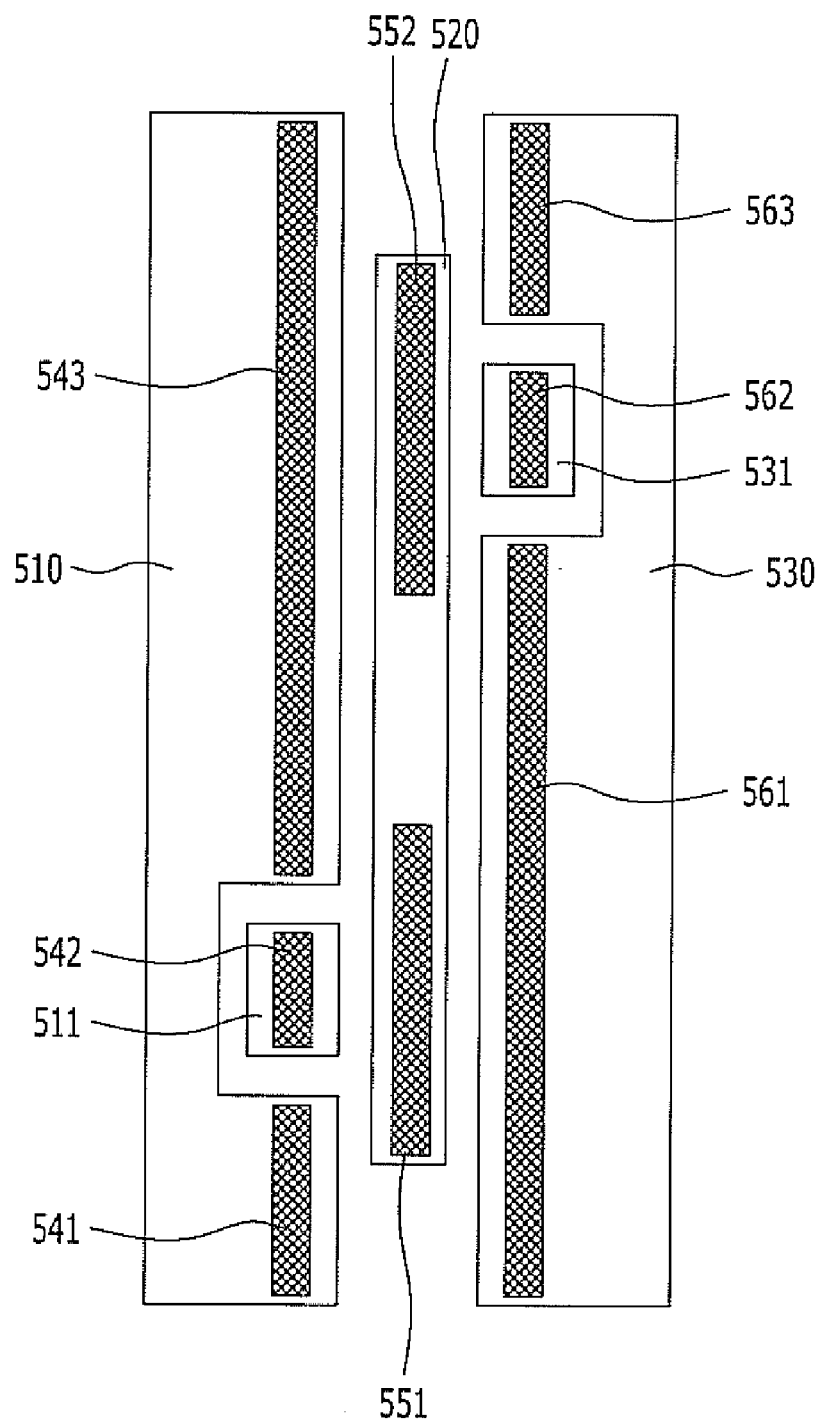
Figure 19:
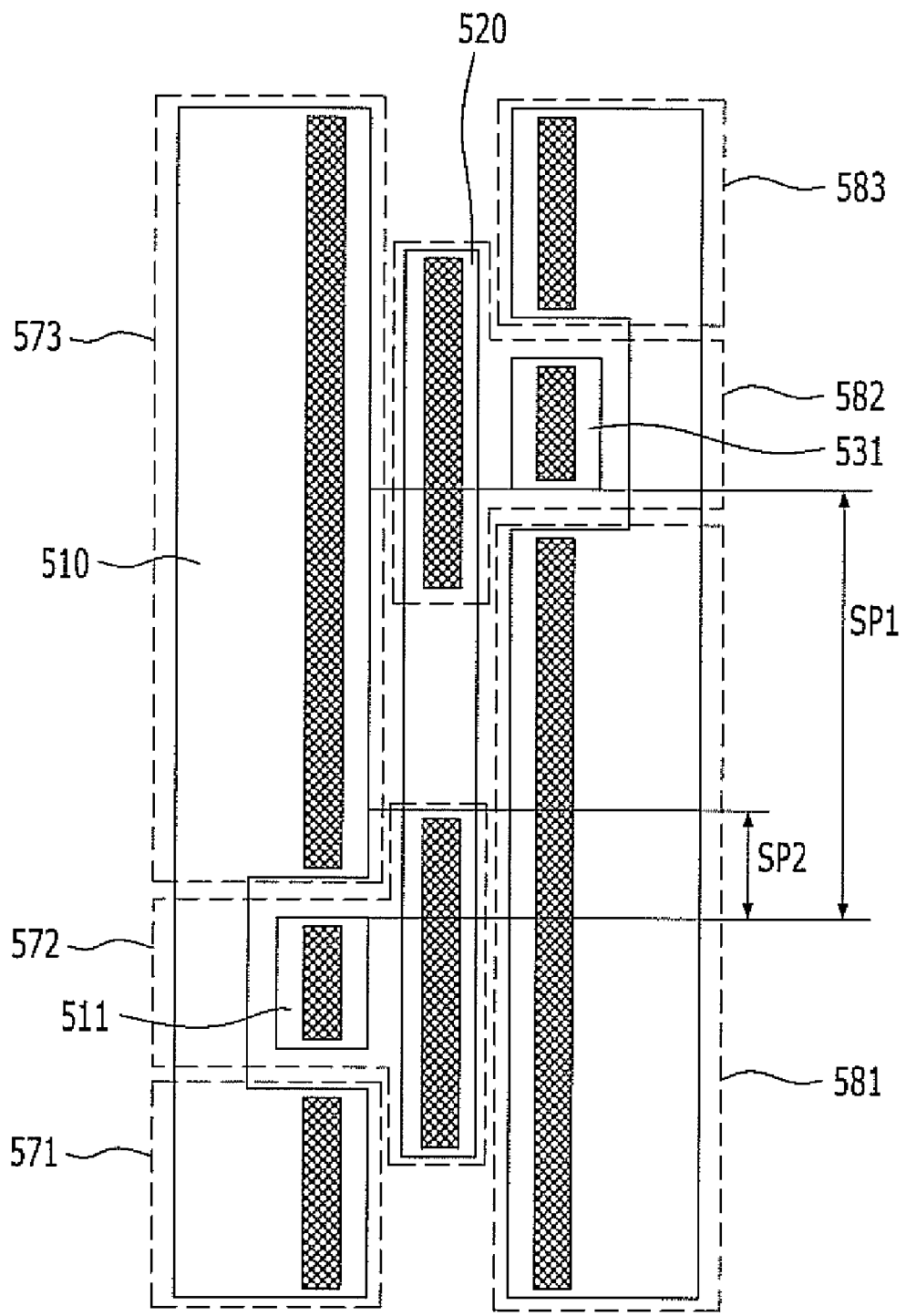

FIGS. 17 to 19 are plan views illustrating the guard ring structure of the chip boundary region in accordance with the third embodiment of the present invention. The lower metal layer of the first guard ring structure includes lower metal layer elements 510 and 511 (shown in FIG. 18). The lower metal layer element 511 transfers electric signals between the device formation region 20A and the mutually coupling element. The lower metal layer element 510 is spaced apart from the lower metal layer element 511 and surrounds a portion of edges of the lower metal layer element 511. For example, the lower metal layer element 510 has a "⊏" shape to surround an upper edge, a lower edge, and a left edge of the lower metal layer element 511 as shown in FIG. 18. The lower metal layer element 511 physically separates the device formation region from the mutually coupling element (for example, 551 and 552).

The metal contact barrier of the first guard ring structure includes metal contact barrier elements 541, 542 and 543. The metal contact barrier element 542 is stacked on the lower metal layer element 511. The metal contact barrier elements 541 and 543 are stacked on the lower metal layer element 510. The metal contact barrier elements 541 and 543 are disposed on both sides of the metal contact barrier element 542.

The upper metal layer of the first guard ring structure includes upper metal layer elements 571, 572 and 573. The upper metal layer element 572 is stacked on the metal contact barrier element 542 and is coupled to the mutually coupling element in order to transfer electric signals between the device formation region 20A and the mutually coupling element. The upper metal layer element 572 has a "⊢" shape. The upper metal layer elements 571 and 573 are stacked on the metal contact barrier elements 541 and 543.

The lower metal layer of the second guard ring structure includes lower metal layer elements 530 and 531. The lower metal layer element 531 transfers electric signals between the scribe line region 40 and the mutually coupling element. The lower metal layer element 530 is spaced apart from the lower metal layer element 531 and surrounds a portion of edges of the lower metal layer element 531 as shown in FIG. 18. For example, the lower metal layer element 530 has a shape to surround an upper edge, a lower edge, and a right edge of the lower metal layer element 531. The lower metal layer element 530 physically separates the scribe line region 40 from the mutually coupling element.

The metal contact barrier of the second guard ring structure includes metal contact barrier elements 561, 562 and 563. The metal contact barrier element 562 is stacked on the lower metal layer element 531. The metal contact barrier elements 561 and 563 are stacked on the lower metal layer element 530. The metal contact barrier elements 561 and 563 are disposed on both sides of the metal contact barrier element 562.

The upper metal layer of the second guard ring structure includes upper metal layer elements 581, 582 and 583. The upper metal layer element 582 is stacked on the metal contact barrier element 562 and is coupled to the mutually coupling element in order to transfer electric signals between the scribe line region 40 and the mutually coupling element. The upper metal layer element 582 has a "⊢" shape. The upper metal layer elements 581 and 583 are stacked on the metal contact barrier elements 561 and 563.

The lower metal layer 520 of the mutually coupling element is spaced apart between the first guard ring structure and the second guard ring structure. The metal contact barrier of the mutually coupling element includes metal contact barrier elements 551 and 552 stacked on the lower metal layer element 520. The upper metal layer of the mutually coupling element includes upper metal layer elements 572 and 582. The upper metal layer element 572 is stacked on the metal contact barrier element 551 in order to transfer electric signals between the device formation region 20A and the mutually coupling element. The upper metal layer element 582 is stacked on the metal contact barrier element 552 in order to transfer electric signals between the scribe line region 40 and the mutually coupling element.

Referring to FIG. 19, as the length SP1 increases, the distance between the metal contact barrier elements 551 and 552 becomes longer, and the length of the upper metal layer 520 of the mutually coupling element increases. Accordingly, since the path between the semiconductor chip and the scribe line region, that is, the path through which external stress and humidity pass to the semiconductor chip gets longer, the effect of the stress or humidity can be reduced. Furthermore, as the length SP2 increases, the same effect can be obtained. This is because as the length SP2 increases, the path between the semiconductor chip and the mutually coupling element gets longer.

As described above, in the guard ring structure of the chip boundary region, the active layer includes the signal transfer element. Accordingly, signals may be transferred between the semiconductor chips and the scribe line regions for the purpose of performing the test operation through test patterns or test circuits implemented in the scribe line regions disposed between the semiconductor chips in order to monitor characteristics of the semiconductor chips on a semiconductor wafer. In such a guard ring structure, two adjacent metal layers and the metal contact barrier formed therebetween may have the dual guard ring structure. The upper metal layer among the metal layers functions to input/output signals between the semiconductor chips or the scribe line regions, and the lower metal layer functions to transfer the inputted/outputted signals to the scribe line regions or the semiconductor chips. Accordingly, signals may be transferred between the semiconductor chips and the scribe line regions in order for the test operation through the test patterns or test circuits implemented in the scribe line region.

Moreover, in accordance with the embodiments of the present invention, the guard ring structure of the chip boundary region can be immune or less subject to mechanical stress occurring during the wafer sawing process, and temperature and humidity change during the use of the chips by lengthening the path between the semiconductor chip and the scribe line region.

Although the active layer and the pair of the metal contact barrier and the metal layer stacked on the active layer has been described with the shape illustrated in the drawings, the active layer may be configured to include the signal transfer element, and the active layer and the pair of the metal contact barrier and the metal layer stacked on the active layer may be configured to include the elements which physically separate the device formation region from the scribe line region. Furthermore, although the guard ring structure including three pairs of the metal contact barriers and the metal layers has been described above, the number of the pairs of the metal contact barriers and the metal layers included in the guard ring structure may vary. Moreover, although the uppermost metal layer, the metal contact barrier and the metal layer formed under the uppermost metal layer in the guard ring structure including three pairs of the metal contact barriers and the metal layers have been described to transfer signals between the semiconductor chips and the scribe line regions, the same function can be implemented by a pair of other adjacent metal layers and the metal contact barrier formed therebetween.

While the present invention has been described with respect to the specific embodiments, it will be apparent to those skilled in the art that various changes and modifications may be made without departing from the spirit and scope of the invention as defined in the following claims.

What is claimed is:

1. A semiconductor wafer comprising:
   at least one chip formed on a substrate; and
   a scribe line region surrounding the chip,
   wherein the chip comprises a device formation region, and
      a chip boundary region surrounding the device formation region and formed between the device formation region and the scribe line region,
   the chip boundary region comprises a guard ring structure unit which physically separates the device formation region from the scribe line region, and
   the guard ring structure unit comprises a signal transfer element which transfers an electric signal between the device formation region and the scribe line region,
   wherein the guard ring structure unit comprises:
      a first guard ring structure configured to physically separate the device formation region from the scribe line region, and transfer an electric signal to/from the device formation region;
      a second guard ring structure configured to physically separate the scribe line region from the device formation region, and transfer an electric signal to/from the scribe line region; and
      a mutually coupling element disposed between the first guard ring structure and the second guard ring structure and configured to transfer an electric signal between the device formation region and the scribe line region.

2. The semiconductor wafer of claim 1, wherein each of the first guard ring structure, the second guard ring structure, and the mutually coupling element comprises:
   a lower metal layer;
   a metal contact barrier stacked on the lower metal layer; and
   an upper metal layer stacked on the metal contact barrier.

3. The semiconductor wafer of claim 2, wherein the lower metal layer of the first guard ring structure comprises:
   a first lower metal layer element configured to transfer an electric signal between the device formation region and the mutually coupling element; and
   a second lower metal layer element spaced apart from the first lower metal layer element, surrounding a portion of edges of the first lower metal layer element, and physically separating the device formation region from the mutually coupling element.

4. The semiconductor wafer of claim 3, wherein the metal contact barrier of the first guard ring structure comprises:
   a first metal contact barrier element stacked on the first lower metal layer element; and
   at least one second metal contact barrier element stacked on the second lower metal layer element.

5. The semiconductor wafer of claim 4, wherein the at least one second metal contact barrier element of the first guard ring structure comprises two metal contact barrier elements disposed on both sides of the first metal contact barrier element.

6. The semiconductor wafer of claim 5, wherein the upper metal layer of the first guard ring structure comprises:
   a first upper metal layer element stacked on the first metal contact barrier element and coupled to the mutually coupling element to transfer an electric signal between the device formation region and the mutually coupling element; and
   second upper metal layer elements stacked on the two metal contact barrier elements of the second metal contact barrier element, respectively.

7. The semiconductor wafer of claim 2, wherein the lower metal layer of the second guard ring structure comprises:
   a first lower metal layer element configured to transfer an electric signal between the scribe line region and the mutually coupling element; and
   a second lower metal layer element spaced apart from the first lower metal layer element, surrounding a portion of edges of the first lower metal layer element, and physically separating the scribe line region from the mutually coupling element.

8. The semiconductor wafer of claim 7, wherein the metal contact barrier of the second guard ring structure comprises:
   a first metal contact barrier element stacked on the first lower metal layer element; and
   a second metal contact barrier element stacked on the second lower metal layer element.

9. The semiconductor wafer of claim 8, wherein the second metal contact barrier element of the second guard ring structure comprises two metal contact barrier elements disposed on both sides of the first metal contact barrier element.

10. The semiconductor wafer of claim 9, wherein the upper metal layer of the second guard ring structure comprises:
    a first upper metal layer element stacked on the first metal contact barrier element and coupled to the mutually coupling element to transfer an electric signal between the scribe line region and the mutually coupling element; and
    second upper metal layer elements stacked on the two metal contact barrier elements of the second metal contact barrier element, respectively.

11. The semiconductor wafer of claim 2, wherein the lower metal layer of the mutually coupling element is disposed between the first guard ring structure and the second guard ring structure, while being spaced apart from each other.

12. The semiconductor wafer of claim 11, wherein the metal contact barrier of the mutually coupling element comprises a first metal contact barrier element and a second metal contact barrier element stacked on the lower metal layer element.

13. The semiconductor wafer of claim 12, wherein the upper metal layer of the mutually coupling element comprises:
  a first upper metal layer element stacked on the first metal contact barrier element and configured to transfer an electric signal between the device formation region and the mutually coupling element; and
  a second upper metal layer element stacked on the second metal contact barrier element and configured to transfer an electric signal between the scribe line region and the mutually coupling element.

* * * * *